US011043504B2

(12) United States Patent  
Yao et al.

(10) Patent No.: US 11,043,504 B2  
(45) Date of Patent: Jun. 22, 2021

(54) METHOD FOR FABRICATING WORD LINES OF NAND MEMORY AND NAND MEMORY COMPRISING WORD LINES FABRICATED BY ADOPTING THE SAME

(71) Applicant: Shanghai Huali Microelectronics Corporation, Shanghai (CN)

(72) Inventors: Shaokang Yao, Shanghai (CN); Xiaohua Ju, Shanghai (CN); Guanqun Huang, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 16/874,209

(22) Filed: May 14, 2020

(65) Prior Publication Data

US 2020/0402842 A1   Dec. 24, 2020

(30) Foreign Application Priority Data

Jun. 21, 2019   (CN) .......................... 201910541364.3

(51) Int. Cl.
*H01L 27/11524* (2017.01)
*H01L 21/027* (2006.01)
(Continued)

(52) U.S. Cl.
CPC .... *H01L 27/11524* (2013.01); *H01L 21/0274* (2013.01); *H01L 21/76816* (2013.01); *H01L 21/76877* (2013.01); *H01L 27/1157* (2013.01)

(58) Field of Classification Search
CPC ............... H01L 21/027; H01L 21/0273; H01L 21/0274; H01L 21/76816; H01L 21/76838; H01L 21/76841; H01L 21/76877; H01L 27/02; H01L 27/0203; H01L 27/10; H01L 27/105; H01L 27/112; H01L 27/115; H01L 27/11517; H01L 27/11524; H01L 27/11526; H01L 27/11529; H01L 27/11531; H01L 27/11563;

(Continued)

(56) References Cited

U.S. PATENT DOCUMENTS 8,202,683 B2 *   6/2012   Lee ..................... H01L 21/0337  
                                                      430/313  
2013/0237050 A1   9/2013   Kikutani  
2015/0318331 A1   11/2015  Pellizzer et al.

FOREIGN PATENT DOCUMENTS

CN   104425220 A   3/2015  
CN   105810641 A   7/2016

OTHER PUBLICATIONS

Jan. 5, 2021—(CN) CNIPA First Search Report Appn 201910541364.3.

* cited by examiner

Primary Examiner — Cheung Lee  
(74) Attorney, Agent, or Firm — Banner & Witcoff, Ltd.

(57) ABSTRACT

Embodiments described herein relate to a method for fabricating word lines of a NAND memory. In the process for fabricating the word lines of the NAND memory, by adding a sacrificial pattern at a position close to a core layer or a sidewall of a select transistor at the edge of the word lines, the actual word line pattern is not at the outermost edge of the pattern, the pattern density of the edge word line pattern is closer to the pattern density of the middle word line pattern, the morphology and size of the edge word line are closer to the morphology and size of the middle area during core layer etching and sidewall etching, and thus the uniformity of the finally etched word lines is improved.

19 Claims, 4 Drawing Sheets

(51) Int. Cl.
*H01L 21/768* (2006.01)
*H01L 27/1157* (2017.01)

(58) Field of Classification Search
CPC ........... H01L 27/11568; H01L 27/1157; H01L 27/11573; H01L 27/11575; H01L 29/78; H01L 29/788
See application file for complete search history.

METHOD FOR FABRICATING WORD LINES OF NAND MEMORY AND NAND MEMORY COMPRISING WORD LINES FABRICATED BY ADOPTING THE SAME

CROSS REFERENCE TO RELATED APPLICATIONS

The present application claims priority to and the benefit of Chinese Patent Application No. 201910541364.3 filed on Jun. 21, 2019, the disclosure of which is incorporated herein by reference in its entirety as part of the present application.

BACKGROUND

The present disclosure relates to a method for fabricating a semiconductor integrated circuit, in particular to a method for fabricating word lines of a NAND memory and a NAND memory comprising word lines fabricated by adopting the method.

NAND memory, as a kind of nonvolatile memories in semiconductor integrated circuits, because of its large capacity, fast rewriting speed, low cost and other advantages, is applicable to data storage and is widely used in the fields of consumption, automobile, industrial electronics and so on.

Please refer to FIG. 1, which is a schematic diagram of architecture of a NAND memory. As illustrated in FIG. 1, a NAND memory array usually consists of a plurality of blocks, each block comprises a plurality of word lines and select transistors, and the select transistors are located at the two ends of each block and are adjacent to the word lines. With the development of technology, the size of word line is continuously shrunk to meet the growing demand of storage capacity. When the word line size is shrunk to less than 40 nm, the word lines are usually fabricated by adopting a double exposure technology, so the word lines and the selectors are fabricated by adopting two masks respectively.

Specifically, please refer to FIG. 2, which is a schematic diagram of a process for fabricating a NAND memory in the prior art. As illustrated in FIG. 2, the process for fabricating the NAND memory in the prior art comprises: S1, depositing a core layer on a to-be-etched layer, and performing exposure and development by adopting a word line mask, wherein the size of the word line mask is twice the actual word line size; S2, etching the core layer and removing the remaining photoresist; S3, shrinking the size of the core layer through a shrinking process; S4, depositing sidewalls and then etching the sidewalls; S5, removing the core layer; S6, performing exposure and development by adopting a select transistor mask, wherein the select transistors use photoresist as a mask and the word lines use the sidewalls as a mask, and etching the to-be-etched layer to finally form the word lines and the select transistors, as illustrated in FIG. 1. In the process from step S2 to step S5, because the pattern density of the core layer or the sidewall adjacent to the select transistor at the edge of the word line is smaller than that of the middle area of the word line, the morphology and size of the sacrificial layer and the sidewall at the edge after etching are different from that of the middle, resulting in that the morphology and size of the word line are not consistent, which affects the uniformity of the property of the storage units.

BRIEF SUMMARY

According to embodiments described herein there is provided a method for fabricating the word lines of the NAND memory. The method for fabricating the word lines of the NAND memory provided by the present disclosure comprises: S1: depositing a core layer on a to-be-etched layer, performing exposure and development by adopting a word line mask, forming a plurality of word line patterns through photoresist, the plurality of word line patterns forming a word line pattern area, and respectively forming sacrificial patterns through photoresist on the two sides of the word line pattern area, the width of the sacrificial pattern being equal to the width of the word line pattern, the spacing between the sacrificial pattern and the word line pattern, the spacing between the sacrificial patterns and the spacing between the word line patterns being equal; S2: etching the core layer by using the photoresist in step S1 as a masking film, and removing the remaining photoresist to form a word line core layer pattern and a sacrificial core layer pattern; S3: shrinking the word line core layer pattern and the sacrificial core layer pattern through a shrinking process; S4: performing a sidewall deposition process and then performing a sidewall etching process to form word line core layer pattern sidewalls and sacrificial core layer pattern sidewalls on the two sides of the word line core layer pattern and the sacrificial core layer pattern respectively; S5: removing the core layer to form word line sidewalls and sacrificial sidewalls; and S6: performing exposure and development by adopting a select transistor mask to enable select transistor photoresist to cover at least part of the sacrificial sidewalls, and then etching the to-be-etched layer by using the select transistor photoresist and the sidewalls as a masking layer to form select transistors and word lines.

According to embodiments described herein there is provided a NAND memory. The NAND memory comprises word lines fabricated by adopting the method for fabricating the word lines of the NAND memory described above.

DETAILED DESCRIPTION

The technical solution of the present disclosure will be clearly and completely described below with reference to the drawings. Obviously, the described embodiments are part of the embodiments of the present disclosure, instead of all of them. Based on the embodiments in the present disclosure, all other embodiments obtained by one skilled in the art without contributing any inventive labor shall fall into the protection scope of the present disclosure.

In one embodiment of the present disclosure, the present disclosure provides a method for fabricating word lines of a NAND memory, comprising: S1: depositing a core layer on a to-be-etched layer, performing exposure and development by adopting a word line mask, forming a plurality of word line patterns through photoresist, the plurality of word line patterns forming a word line pattern area, and respectively forming sacrificial patterns through photoresist on the two sides of the word line pattern area, the width of the sacrificial pattern being equal to the width of the word line pattern, the spacing between the sacrificial pattern and the word line pattern, the spacing between the sacrificial patterns and the spacing between the word line patterns being equal; S2: etching the core layer by using the photoresist in step S1 as a masking film, and removing the remaining photoresist to form a word line core layer pattern and a sacrificial core layer pattern; S3: shrinking the word line core layer pattern and the sacrificial core layer pattern through a shrinking process; S4: performing a sidewall deposition process and then performing a sidewall etching process to form word line core layer pattern sidewalls and sacrificial core layer pattern sidewalls on the two sides of the word line core layer pattern and the sacrificial core layer pattern respectively; S5: removing the core layer to form word line sidewalls and sacrificial sidewalls; and S6: performing exposure and development by adopting a select transistor mask to enable select transistor photoresist to cover at least part of the sacrificial sidewalls, and then etching the to-be-etched layer by using the select transistor photoresist and the sidewalls as a masking layer to form select transistors and word lines.

Figure 1:
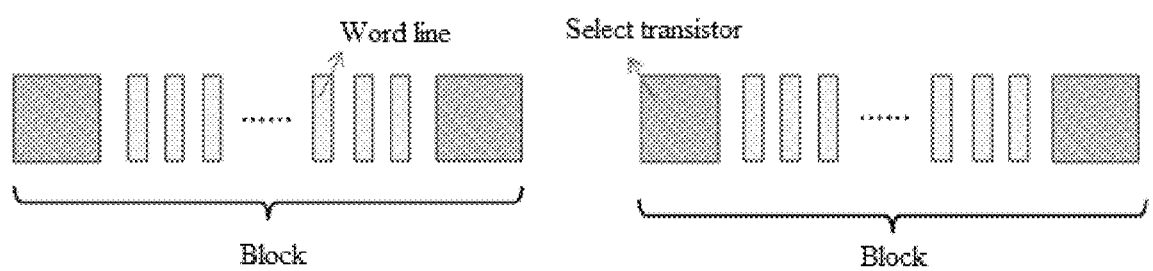
FIG. 1 is a schematic diagram of architecture of a NAND memory.
Figure 2:
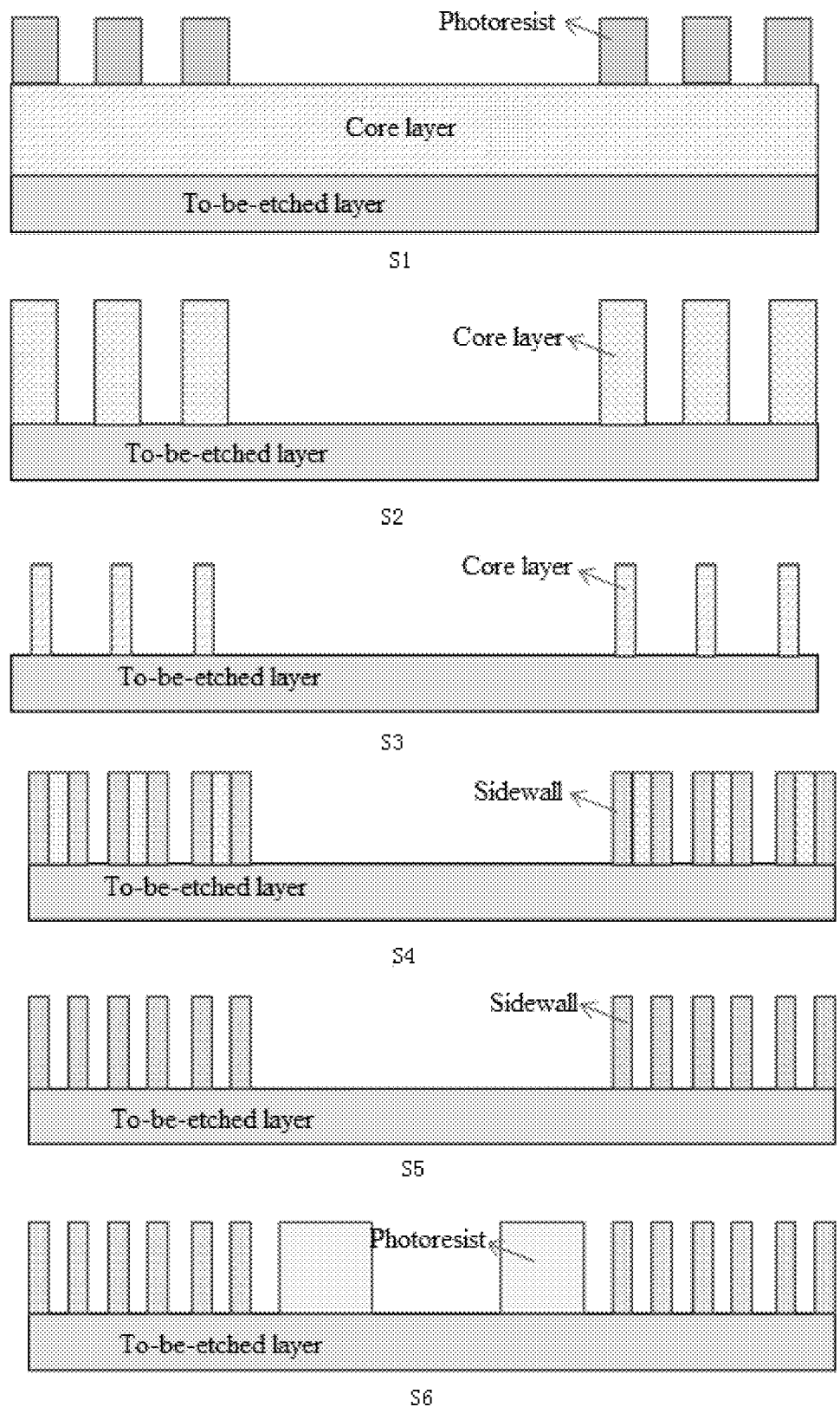
FIG. 2 is a schematic diagram of a process for fabricating a NAND memory in the prior art.
Figure 3:
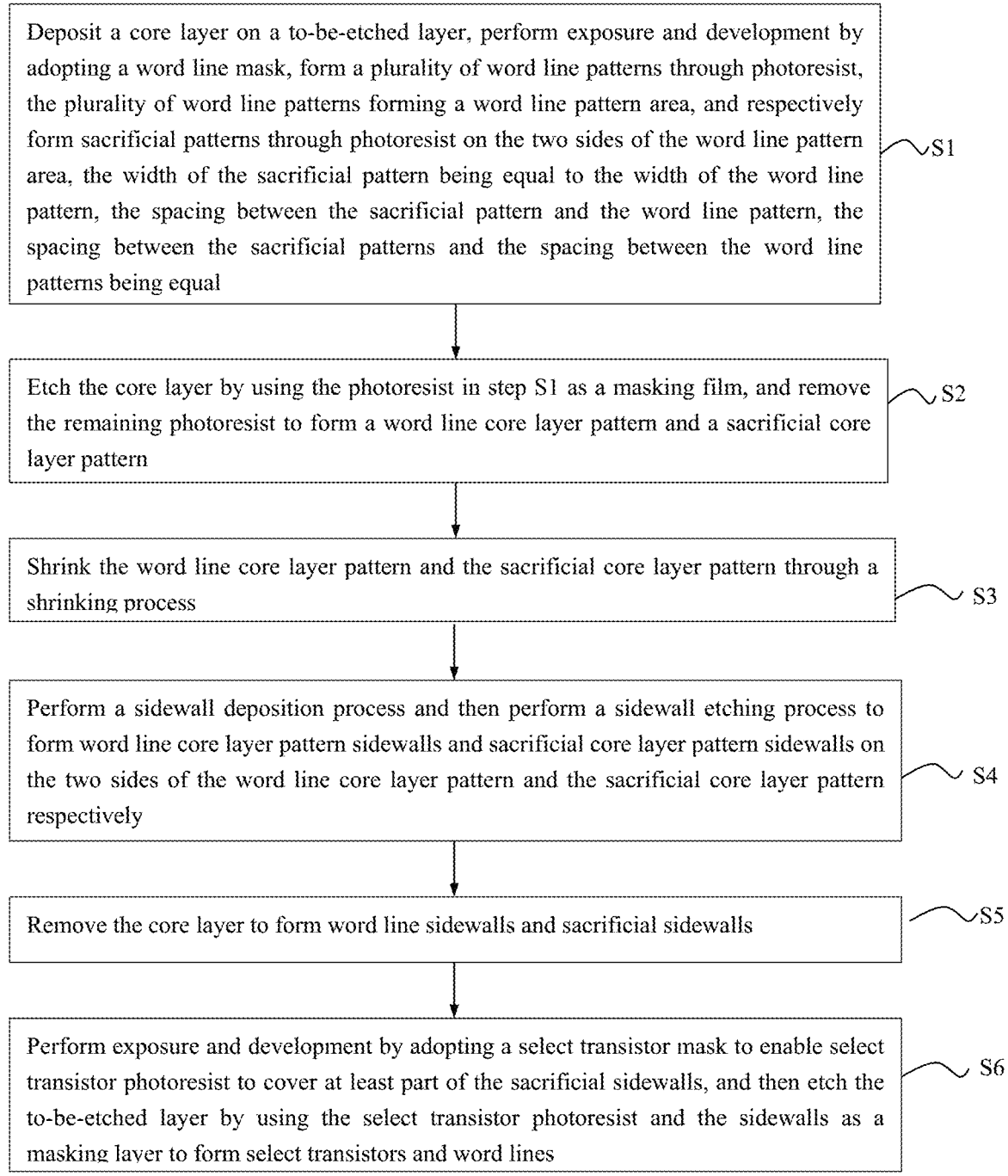
FIG. 3 is a flowchart of a method for fabricating word lines of a NAND memory according to one embodiment of the present disclosure.
Figure 4:
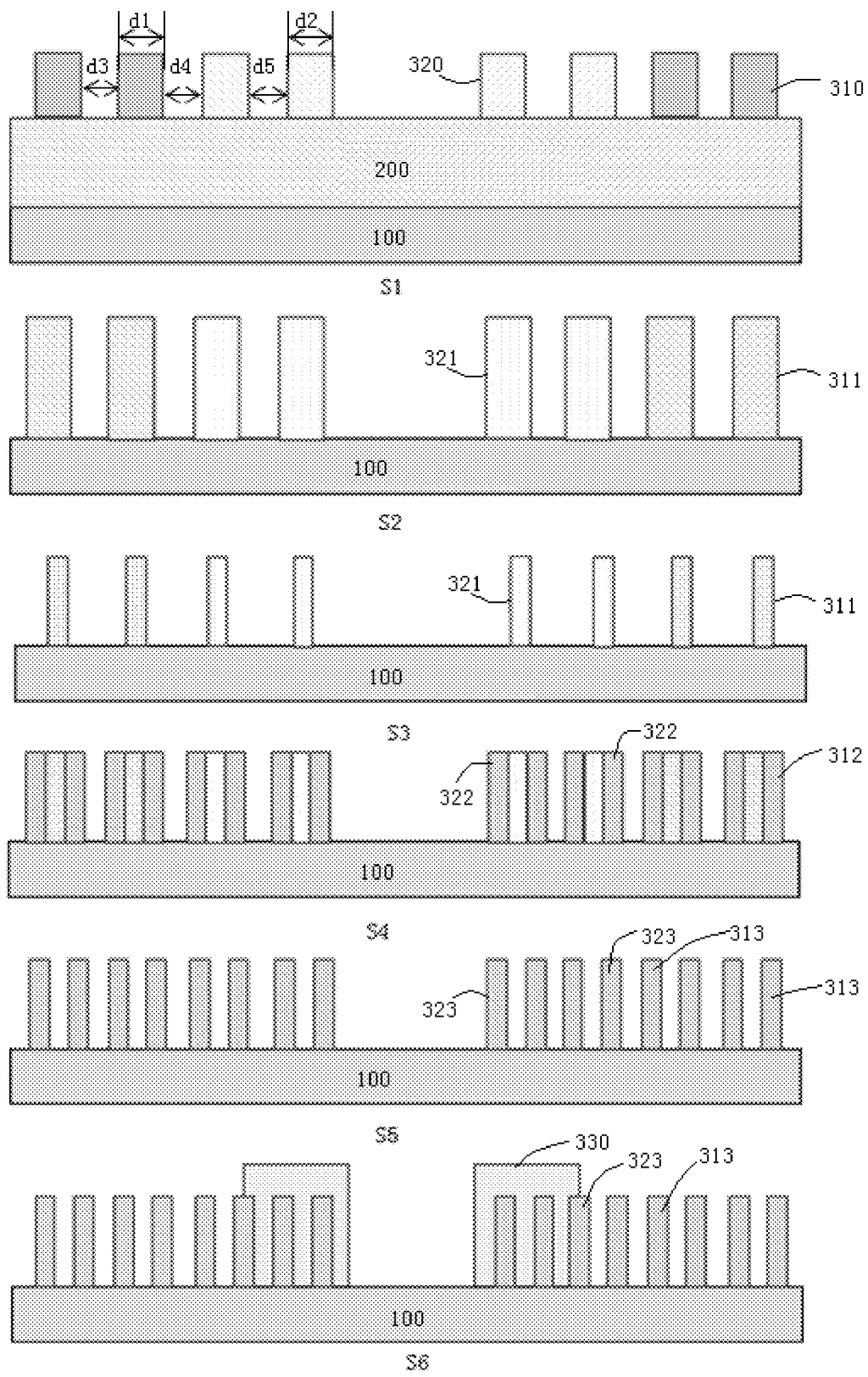
FIG. 4 is a schematic diagram of a process for fabricating word lines of a NAND memory according to one embodiment of the present disclosure.

Specifically, please refer to FIG. 3, which is a flowchart of a method for fabricating word lines of a NAND memory according to one embodiment of the present disclosure, and please also refer to FIG. 4, which is a schematic diagram of a process for fabricating word lines of a NAND memory according to one embodiment of the present disclosure. In combination with FIG. 3 and FIG. 4, the method for fabricating the word lines of the NAND memory according to one embodiment of the present disclosure comprises the following steps:

In step S1, a core layer 200 is deposited on a to-be-etched layer 100, exposure and development are performed by adopting a word line mask, a plurality of word line patterns 310 are formed through photoresist, the plurality of word line patterns 310 form a word line pattern area, sacrificial patterns 320 are respectively formed through photoresist on the two sides of the word line pattern area, the width of the sacrificial pattern 320 is equal to the width of the word line pattern 310, and the spacing between the sacrificial pattern 320 and the word line pattern 310, the spacing between the sacrificial patterns 320 and the spacing between the word line patterns 310 are equal.

Preferably, the number of the sacrificial patterns 320 is two. However, the number of the sacrificial patterns 320 may also be changed according to the development and design needs of the NAND memory technology.

Specifically, as illustrated in FIG. 4, the width d2 of the sacrificial pattern 320 is equal to the width of the word line pattern 310. The spacing d4 between the sacrificial pattern 320 and the word line pattern 310, the spacing d5 between the sacrificial patterns 320 and the spacing d3 between the word line patterns 310 are equal, i.e., the pitch of the sacrificial patterns 320 is kept consistent with that of the word line patterns 310.

In one embodiment, the material of the core layer is silicon oxide, silicon nitride or polysilicon. In one embodiment, the core layer is formed by adopting Low Pressure Chemical Vapor Deposition (LPCVD) or Plasma Enhanced Chemical Vapor Deposition (PECVD).

In step S2, the core layer 200 is etched by using the photoresist in step S1 as a masking film, and the remaining photoresist is removed to form a word line core layer pattern 311 and a sacrificial core layer pattern 321.

Further, in one embodiment of the present disclosure, the core layer 200 is etched by adopting a dry etching process.

More specifically, in one embodiment of the present disclosure, two sacrificial core layer patterns 321 are formed.

In step S3, the word line core layer pattern 311 and the sacrificial core layer pattern 321 are shrunk through a shrinking process.

Further, in one embodiment of the present disclosure, the shrinking process is performed by adopting a wet etching process. Further, in one embodiment of the present disclosure, the width of the word line core layer pattern 311 and the sacrificial core layer pattern 321 is reduced by a half through the shrinking process.

In step S4, a sidewall deposition process is performed and then a sidewall etching process is performed to form word line core layer pattern sidewalls 312 and sacrificial core layer pattern sidewalls 322 on the two sides of the word line core layer pattern 311 and the sacrificial core layer pattern 321 respectively.

Further, in one embodiment of the present disclosure, the material of the sidewalls is silicon oxide, silicon nitride or polysilicon, and is different from the material of the core layer. Further, in one embodiment of the present disclosure, the sidewalls are formed by adopting Low Pressure Chemical Vapor Deposition (LPCVD) or low-temperature Atomic Layer Deposition (ALD). In one embodiment of the present disclosure, the sidewall etching process etches out the materials at positions other than the required width of the sidewalls on the two sides of the word line core layer pattern 311 and the sacrificial core layer pattern 321 on the to-be-etched layer 100, and the materials deposited on the word line core layer pattern 311 and the sacrificial core layer pattern 321 through the sidewall deposition process. Further, the required width of the sidewalls is equal to the width of the prefabricated word lines.

In step S5, the core layer is removed to form word line sidewalls 313 and sacrificial sidewalls 323.

In one embodiment of the present disclosure, the core layer is removed by adopting a wet process. More specifically, in one embodiment of the present disclosure, wet solution for the wet process is a high-selectivity etchant, such that the word line core layer pattern sidewalls 312 and the sacrificial core layer pattern sidewalls 322 are prevented from being corroded. In one embodiment of the present disclosure, the number of the sacrificial sidewalls 323 is four.

In step S6, exposure and development are performed by adopting a select transistor mask to enable select transistor photoresist 330 to cover at least part of the sacrificial sidewalls 323, and then the to-be-etched layer 100 is etched by using the select transistor photoresist 330 and the sidewalls as a masking layer to form select transistors and word lines.

In one embodiment of the present disclosure, the select transistor photoresist 330 covers at least three sacrificial sidewalls 323. More specifically, in one embodiment of the present disclosure, the boundary of the select transistor photoresist 330 close to the word line sidewall 313 is located at the middle position of one sacrificial sidewall 323. As illustrated in FIG. 4, in the drawing corresponding to step S6, in the memory block on the right side, the boundary of the select transistor photoresist 330 close to the word line sidewall 313 is located at the middle position of the third sacrificial sidewall 323 from the left side, i.e., the right side of the select transistor photoresist 330 is located at the middle position of the third sacrificial sidewall 323 from the left side. In one embodiment of the present disclosure, the side of the select transistor photoresist 330 far away from the word line sidewall 313 at least covers ½ of the sacrificial sidewall farthest away from the word line sidewall 313. As illustrated in FIG. 4, in the drawing corresponding to step S6, in the memory block on the right side, the side of the select transistor photoresist 330 far away from the word line sidewall 313 covers ½ of the sacrificial sidewall 323 on the leftmost side, or as illustrated in FIG. 4, in the drawing corresponding to step S6, it extends to a position outside the sacrificial sidewall 323 on the leftmost side.

More specifically, in one embodiment of the present disclosure, the present disclosure further provides a NAND memory comprising word lines fabricated by adopting the method for fabricating the word lines of the NAND memory.

To sum up, in the process for fabricating the word lines of the NAND memory, by adding a sacrificial pattern at a position close to a core layer or a sidewall of a select transistor at the edge of the word lines, the actual word line pattern is not at the outermost edge of the pattern, the pattern density of the edge word line pattern is closer to the pattern density of the middle word line pattern, the morphology and size of the edge word line are closer to the morphology and size of the middle area during core layer etching and sidewall etching, and thus the uniformity of the finally etched word lines is improved.

Finally, it should be noted that the above embodiments are only used for describing the technical solutions of the present disclosure, instead of limiting the technical solutions. Although the present disclosure is described in detail with reference to the above embodiments, it should be understood by one skilled in the art that the technical solutions recorded in the above embodiments may still be modified, or some or all of the technical features may be replaced equivalently. These modifications or replacements do not make the essence of the corresponding technical solution deviate from the scope of the technical solutions of the embodiments of the present disclosure.

What is claimed is:

1. A method for fabricating word lines of a NAND memory, wherein the method for fabricating the word lines of the NAND memory comprises:
   S1: depositing a core layer on a to-be-etched layer, performing exposure and development by adopting a word line mask, forming a plurality of word line patterns through photoresist, the plurality of word line patterns forming a word line pattern area, and respectively forming sacrificial patterns through photoresist on two sides of the word line pattern area, the width of the sacrificial pattern being equal to the width of the word line pattern, a spacing between the sacrificial pattern and the word line pattern, a spacing between the sacrificial patterns and a spacing between the word line patterns being equal;
   S2: etching the core layer by using the photoresist in step S1 as a masking film, and removing a remaining photoresist to form a word line core layer pattern and a sacrificial core layer pattern;
   S3: shrinking the word line core layer pattern and the sacrificial core layer pattern through a shrinking process;
   S4: performing a sidewall deposition process and then performing a sidewall etching process to form word line core layer pattern sidewalls and sacrificial core layer pattern sidewalls on two sides of the word line core layer pattern and the sacrificial core layer pattern respectively;
   S5: removing the core layer to form word line sidewalls and sacrificial sidewalls; and
   S6: performing exposure and development by adopting a select transistor mask to enable select transistor photoresist to cover at least part of the sacrificial sidewalls, and then etching the to-be-etched layer by using the select transistor photoresist and the sacrificial sidewalls as a masking layer to form select transistors and word lines.

2. The method for fabricating the word lines of the NAND memory according to claim 1, wherein the number of the sacrificial patterns in step S1 is two.

3. The method for fabricating the word lines of the NAND memory according to claim 2, wherein two sacrificial core layer patterns are formed in step S2.

4. The method for fabricating the word lines of the NAND memory according to claim 3, wherein the number of the sacrificial sidewalls formed in step S5 is four.

5. The method for fabricating the word lines of the NAND memory according to claim 1, wherein a material of the core layer in step S1 is silicon oxide, silicon nitride or polysilicon.

6. The method for fabricating the word lines of the NAND memory according to claim 5, wherein a material of the sidewalls in step S4 is silicon oxide, silicon nitride or polysilicon, and is different from the material of the core layer.

7. The method for fabricating the word lines of the NAND memory according to claim 1, wherein the core layer is formed by adopting low pressure chemical vapor deposition or plasma enhanced chemical vapor deposition.

8. The method for fabricating the word lines of the NAND memory according to claim 1, wherein the core layer is etched by adopting a dry etching process in step S2.

9. The method for fabricating the word lines of the NAND memory according to claim 1, wherein the shrinking process is performed by adopting a wet etching process in step S3.

10. The method for fabricating the word lines of the NAND memory according to claim 1, wherein the width of the word line core layer pattern and the sacrificial core layer pattern is reduced by a half through the shrinking process.

11. The method for fabricating the word lines of the NAND memory according to claim 1, wherein the sidewalls in step S4 are formed by adopting low pressure chemical vapor deposition or low-temperature atomic layer deposition.

12. The method for fabricating the word lines of the NAND memory according to claim 1, wherein the sidewall etching process in step S4 etches out materials at positions other than a required width of the sidewalls on the two sides of the word line core layer pattern and the sacrificial core layer pattern on the to-be-etched layer, and the materials deposited on the word line core layer pattern and the sacrificial core layer pattern through the sidewall deposition process.

13. The method for fabricating the word lines of the NAND memory according to claim 12, wherein the required width of the sidewalls is equal to the width of prefabricated word lines.

14. The method for fabricating the word lines of the NAND memory according to claim 1, wherein the core layer is removed by adopting a wet process in step S5.

15. The method for fabricating the word lines of the NAND memory according to claim 14, wherein wet solution for the wet process is a high-selectivity etchant.

16. The method for fabricating the word lines of the NAND memory according to claim 1, wherein the select transistor photoresist covers at least three sacrificial sidewalls in step S6.

17. The method for fabricating the word lines of the NAND memory according to claim 1, wherein in step S6, a boundary of the select transistor photoresist close to the word line sidewall is located at a middle position of one sacrificial sidewall.

18. The method for fabricating the word lines of the NAND memory according to claim 1, wherein in step S6, a side of the select transistor photoresist far away from the word line sidewall at least covers ½ of the sacrificial sidewall farthest away from the word line sidewall.

19. A NAND memory, wherein the NAND memory comprises word lines fabricated by adopting the method for fabricating the word lines of the NAND memory claimed by claim 1.

* * * * *